US005661304A

United States Patent [19]
Kimura et al.

[11] Patent Number: 5,661,304
[45] Date of Patent: Aug. 26, 1997

[54] MULTI-PURPOSE NONINTERCEPTIVE CHARGED PARTICLE BEAM DIAGNOSTIC DEVICE USING DIFFRACTION RADIATION AND METHOD FOR ITS USE

[75] Inventors: Wayne D. Kimura, Bellevue, Wash.; Ralph B. Fiorito; Donald W. Rule, both of Silver Spring, Md.

[73] Assignee: STI Optronics, Inc., Bellevue, Wash.

[21] Appl. No.: 643,178

[22] Filed: May 6, 1996

[51] Int. Cl.⁶ .................................................. H01J 37/245
[52] U.S. Cl. .......................... 250/397; 250/305; 250/310
[58] Field of Search ................................... 250/397, 310, 250/311, 305

[56]   References Cited

U.S. PATENT DOCUMENTS 3,917,946  11/1975  Van Oostrum .................... 250/397
5,045,695   9/1991  Rule et al. ........................ 250/305
5,120,968   6/1992  Fiorito et al. .................... 250/397
5,336,886   8/1994  Itoh .................................. 250/305

*Primary Examiner*—Jack I. Berman
*Assistant Examiner*—Kiet T. Nguyen
*Attorney, Agent, or Firm*—Robert M. Storwick

[57]   ABSTRACT

A method and apparatus for detecting diffraction radiation from a charged particle beam in order to measure parameters that characterize the charged particle beam. The charged particle beam passes near one or more edges, apertures, or interfaces between media of different dielectric constants such that the beam is not intercepted. This generates forward diffraction radiation and reflected diffraction radiation at an angle relative to the direction of the beam. The radiation passes through a focusing system and onto a detector which measures a desired parameter.

31 Claims, 3 Drawing Sheets

MULTI-PURPOSE NONINTERCEPTIVE CHARGED PARTICLE BEAM DIAGNOSTIC DEVICE USING DIFFRACTION RADIATION AND METHOD FOR ITS USE

TECHNICAL FIELD

The present invention relates to methods and apparatus for detecting radiation from a charged particle beam, and more particularly, to methods and apparatus for detecting diffraction radiation from a charged particle beam in order to measure parameters that characterize the charged particle beam.

BACKGROUND OF THE INVENTION

Most methods for measuring the properties of a relativistic charged particle beam are generally destructive to the beam. That is, the methods require inserting an object, such as a element, phosphor screen, or wire, which intercepts the beam. Intercepting the beam also disturbs the beam and complicates tuning accelerator systems used to accelerate and transport the beam. Older measurement methods also suffer from being cumbersome, requiring multiple sensing stations that prevent real-time measurements, and being unable to measure all parameters of interest with a single device. The cumbersome nature of older methods is a result of the need to insert screens and beam collimators. The need for multiple sensing stations is illustrated by wire scanners and wire scanners combined with focusing magnets.

More recent diagnostics based upon transition radiation overcome many of the limitations and problems of the older methods based on diffraction radiation. However, a transition radiation diagnostic requires an intercepting element and, hence, is also a concurrently disruptive measurement process. Prior art noninterceptive beam diagnostics, such as wall current monitors, do exist. However, these prior art diagnostics require placement at multiple stations along the transport line of the beam accelerator. The prior art diagnostics also require elaborate mathematical analysis to produce any parameters other than the simplest beam parameters (for example, to produce the centroid position of the beam). In addition, the prior art noninterceptive beam diagnostics are highly susceptible to electrical noise within the transport line of the accelerator beam.

Other nondestructive monitors require complex, cumbersome waveguide structures designed for a machine-specific beam parameter range and long time scales to produce their results. Included among such other monitors are monitors of centroid position and bunch length, such as cavities coupled to the beam's field. Furthermore such other nondestructive monitors cannot measure other important beam properties such as the beam divergence, spatial distribution, energy, and emittance.

Only one highly specific use of diffraction radiation has been demonstrated and reported in the literature. That use was as a bunch length measurement device, and is reported in Y. Shibata, et. al., Phys. Rev. E 52, 6787 (1995). However, this device suffers from a number of serious difficulties. Because of the geometry of its design, the bunch length measurement device of Shibata is destructive to the particle beam. This fact restricts the observations and measurements of Shibata's bunch length measurement device to forward-directed (zero degrees) and backward-directed (180 degrees) diffraction radiation.

This geometry necessitates the use of mirrors. The mirrors intercept the beam in the course of the measurement and produce transition radiation as a result. The transition radiation produced with the diffraction radiation from the aperture severely complicates both the measurement and the analysis of the diffraction radiation. The analysis of the diffraction radiation is used to diagnose the bean's bunch shape.

The bunch length measurement device is restricted to bunch length measurements in the far infrared region of the spectrum and, hence, is limited in its applicability. Furthermore, the bunch length measurement device does not diagnose the beam divergence, beam position, spatial distribution, energy, or emittance, and is not capable of real time monitoring. The charged particle beam diagnostic device of the present invention overcomes the limitations and complications of the prior art.

SUMMARY OF THE INVENTION

According to one aspect, the invention is an apparatus to determine any one or more of a predetermined group of parameters relating to a charged particle beam. The charged particle beam contains one or more charged particles, has a trajectory, and has a transverse cross-section along the trajectory. The one or more parameters are determinable at any point along the beam trajectory.

The apparatus comprises a diffraction radiation generator, a first focusing system, and a first detector. The diffraction radiation generator is disposed within the beam. The diffraction radiation generator generates forward diffraction radiation along a forward direction along the direction of the beam and reflected diffraction radiation at a predetermined angle with respect to the direction of the beam. Each of the forward diffraction radiation and the reflected diffraction radiation has a direction. The diffraction radiation generator includes an element that has a feature such that the beam can pass adjacent the feature without being intercepted by the element.

The first focusing system is disposed along at least one of the forward diffraction radiation and the reflected diffraction radiation and has an output plane. The first focusing system collects the diffraction radiation along the direction of at least one of the forward diffraction radiation and the reflected diffraction radiation and detects the diffraction radiation on the output plane.

The first detector is disposed at the output plane of the first focusing system to measure the diffraction radiation.

In accordance with a second embodiment, the invention includes a method for determining any one or more of a predetermined group of parameters relating to a charged particle beam containing one or more charged particles. The beam has a trajectory and a transverse cross-section along the trajectory, the one or more parameters being determinable at any point along the beam trajectory. The method comprises the steps of: a) supplying a diffraction radiation generator; b) disposing the diffraction radiation generator within the beam; c) supplying a focusing system having an output plane; d) disposing the focusing system along at least one of the forward diffraction radiation and the reflected diffraction radiation; e) supplying a detector; and f) disposing the detector at the output plane of the focusing system.

In accordance with the summarized method of the invention, the diffraction radiation generator generates forward diffraction radiation along a forward direction along the direction of the beam and reflected diffraction radiation at an angle with respect to the direction of the beam. Each of the forward diffraction radiation and the reflected diffraction radiation has a direction, and the diffraction radiation generator includes an element having a feature such that the beam can pass adjacent the feature without being intercepted by the element. The focusing system collects the diffraction radiation along the direction of at least one of the forward diffraction radiation and the reflected diffraction radiation and detecting the diffraction radiation on the output plane.

DETAILED DESCRIPTION OF THE PREFERRED EMBODIMENT OF THE INVENTION

The purpose of the inventive method and apparatus is to measure noninterceptively, and in real-time, the transverse (spatial) distribution, longitudinal (temporal) distribution, divergence, emittance, centroid position and energy of a charged particle beam. The device makes it possible to obtain these measurements in a time-integrated or time-resolved manner. Hence, the overall object of this invention is as a general purpose, noninterceptive, multi-parameter charged particle beam diagnostic device.

The present invention uses the properties of the radiation produced by a relativistic charged particle beam that passes by the edge of an object that is close to the beam. The properties are used to diagnose the characteristics of the beam.

This type of radiation is known in the literature as diffraction radiation. Earlier theoretical discussion of diffraction radiation and possibilities for its use for beam diagnostics is mentioned in "The Use of Transition Radiation as a Diagnostic for Intense Beams," by D. W. Rule and R. B. Fiorito, Naval Surface Weapons Center Tech. Report 84–134, July, 1984.

Since the beam does not physically touch the object, but only passes close to it, the present invention can measure all the beam properties mentioned above with minimal disturbance to the beam. In other words, the present invention is a multi-function, noninterceptive charged particle beam diagnostic device.

Figure 1:
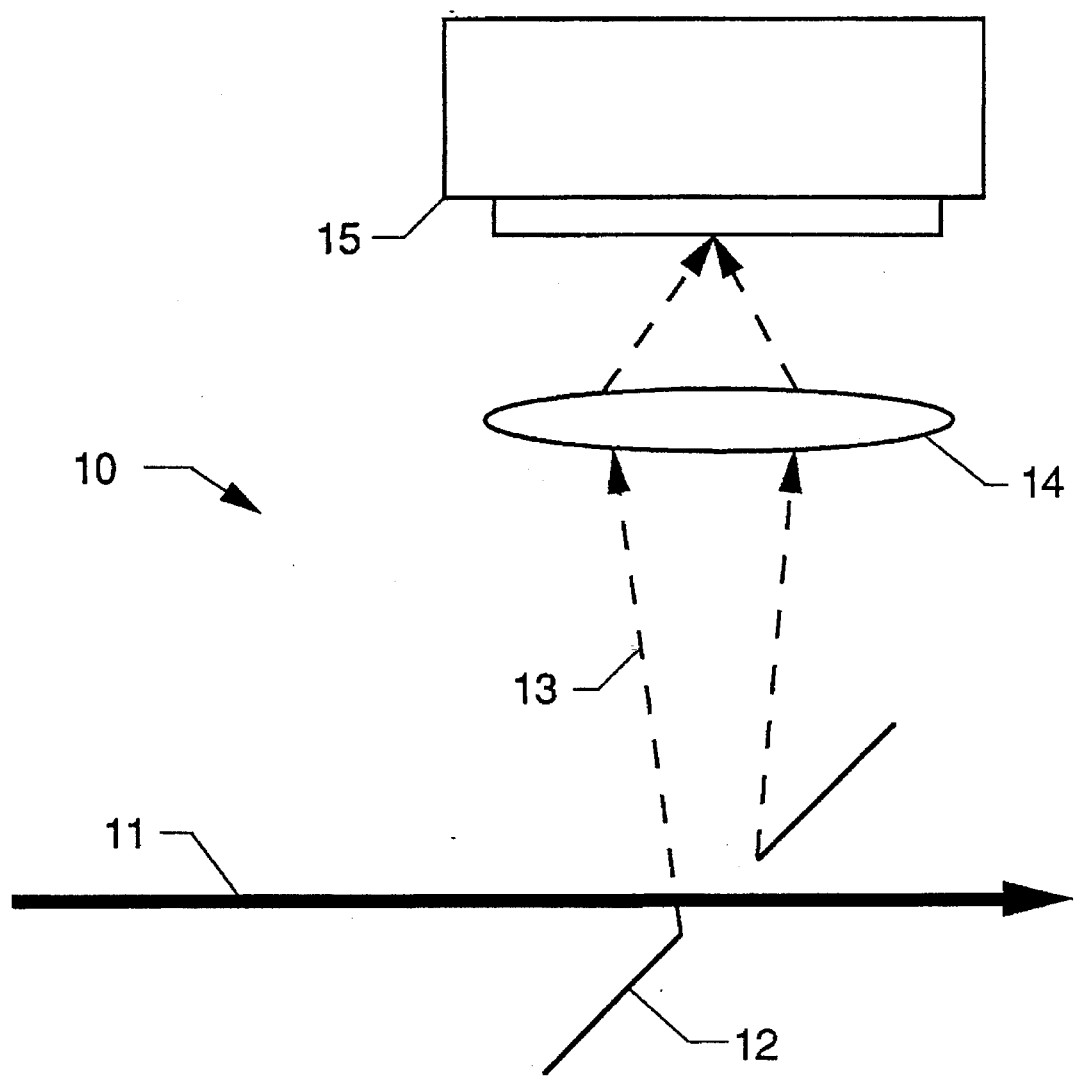
FIG. 1 is a schematic diagram of a preferred embodiment of the invention.

FIG. 1 is a schematic diagram of a preferred embodiment of the invention. The inventive apparatus is denoted in general by the numeral 10. FIG. 1 also shows a charged particle beam 11. The charged particle beam 11 is typically composed, for example, of electrons, protons, or ions. The preferred embodiment of the apparatus 10 includes a diffraction radiation generator 12, such as a single foil or mirror with an aperture or edge. In general, the diffraction radiation generator 12 can include one or more elements, each element having a feature such as an edge (for example, as part of an aperture) or an interface between media of different dielectric constants. The edge (or aperture) can have an arbitrary, and variable size and shape, including circular and rectangular shapes.

The apparatus 10 also includes an optical system 14 and a detector system 15. The optical system 14 can include either a simple or complex lens or mirror focusing system for collecting the diffraction radiation 13. A conventional computer system and associated software, programmed according to methods and techniques known to those skilled in the art, are used to analyze the diffraction radiation and to display the diagnostic information about the charged particle beam and are not shown in FIG. 1.

Typically, the charged particle beam 11 and the diffraction radiation generator 12 will be enclosed inside an evacuated tube, pipe, or chamber. The diameter of the aperture in the diffraction radiation generator 12 is chosen to be larger than the diameter of the charged particle beam, so that the beam does not strike any part of the physical structure of the element or object with an edge; nevertheless, the beam's radial electromagnetic field, does interact with the aperture or edge. When the size of the aperture 12 or distance from the charged particle beam 11 to the edge of the diffraction radiation generator 12 is nominally of the order of (that is, within a factor of ten of) $\gamma\lambda$, where $\gamma$ is the relativistic Lorenz factor of the beam and $\lambda$ is the observed diffraction radiation wavelength, significant and measurable diffraction radiation 13 is produced. The relativistic Lorenz factor is equal to the total energy of the charged particle beam divided by the rest mass energy of the particle. The optimum wavelength of the diffraction radiation produced is determined by the size and energy of the beam being diagnosed.

For a relativistic ($\gamma \gg 1$) beam, the diffraction radiation 13 is produced in a narrow cone whose opening angle is given by $1/\gamma$, directed about zero degrees (forward diffraction radiation) and, for an inclined element, in the direction of specular reflection (reflected diffraction radiation). The diffraction radiation is directed out of the path of the beam through a window on the tube, pipe, or chamber to the radiation collector.

In FIG. 1, the diffraction radiation generator 12, positioned at an angle of 45 degrees with respect to the direction of the charged particle beam 11, serves as a generator of diffraction radiation. Reflected diffraction radiation from this element 13 is directed at 90 degrees from the beam and collected by the focusing system 14 whose acceptance aperture is sufficiently large enough to collect a large fraction of the diffraction radiation pattern from the entire aperture of the diffraction radiation generator 12. A sufficient collection angle would be on the order of $3/\gamma$ to $4/\gamma$.

This diffraction radiation pattern is focused onto the detector 15 using the focusing system 14. One embodiment for the detector 15 for visible wavelength diffraction radiation is a video camera or linear array. This type of detector can image the angular distribution pattern of the diffraction radiation, or the spatial distribution of the diffraction radiation by focusing the diffraction radiation on the element with a focusing system 14. Another embodiment of 15 is a spectrally sensitive detector such as an optical spectrometer. Other suitable detectors are readily available for observing diffraction radiation in the infrared, and other regions of the electromagnetic spectrum.

Measurement of the angular and spectral distributions of diffraction radiation described above can be analyzed, using appropriate mathematical theory to determine the beam divergence and energy. The basis for the mathematical theory has been used in the prior art for optical transition radiation. A discussion and references to the papers and reports on this subject are contained in "Optical Transition Radiation Beam Emittance Diagnostics", by R. B. Fiorito and D. W. Rule, Conference Proc. No. 319; Beam Instrumentation Workshop, ed. by R. E. Shafer (AIP, 1994).

Measurement of the spatial characteristics of the diffraction radiation obtained by imaging the spatial distribution of the diffraction radiation generator itself, can be used to determine the beam's spatial distribution. The product of the divergence and beam size (obtained from the beam spatial distribution) defines the beam emittance, when the beam is focused to a waist condition at the diffraction radiation generator, as has been done in the prior art for optical transition radiation.

The diffraction radiation diagnostic device can use either incoherent or coherent diffraction radiation. Coherent diffraction radiation is produced by an entire bunch or pulse length $L_{bp}$ of beam charges radiating in phase, and is produced at wavelengths corresponding to the length of a single beam bunch, i.e., $L_{bp} \sim \lambda \sim 2\pi r/\gamma$, where r is the beam radius and $\lambda$ and $\gamma$ are defined above. To produce coherent diffraction radiation, the aperture size must be approximately equal to or smaller than $\lambda\gamma/2\pi$. In this case the device can measure and diagnose the longitudinal distribution and bunch length of the beam in addition to the other beam parameters mentioned above, thus providing a suite of beam diagnostic capabilities embodied in no other device. Coherent diffraction radiation has an intensity substantially larger than incoherently generated diffraction radiation. The multiplication factor equals the number of charges in the bunch, which, for a typical beam bunch can be quite large ($10^6$ or larger). This large increase in signal makes the use of coherent diffraction radiation an attractive option for operating the diagnostic device for appropriate beam conditions. Bunch length measurements in the sub-millimeter to millimeter regime have been shown using far infrared coherent diffraction radiation, Y. Shibata, et. al., Phys. Rev. E 52, 6787 (1995). However, other bunch length regimes can be measured (for example, the near infrared region), using commercially available Fourier transform spectrometers.

The overall advantages of this device are similar to those for a beam diagnostic based upon optical transition radiation, as discussed in U.S. Pat. No. 5,120,968. These advantages include 1) a simpler geometry that does not require using collimators or magnets; 2) a capability of obtaining measurements in one location, thereby eliminating the necessity of modeling the changes of the charged particle beam as it travels between detectors; 3) elimination of scanning devices or variation of magnetic focusing strength; 4) production of a device that is potentially less expensive than many other schemes; 5) a compact geometry that permits it to be used in confined spaces; and 6) a device that is very insensitive to electrical noise.

A major distinction between the present invention and optical transition radiation devices known in the prior art is that the present inventive diffraction radiation device is noninterceptive. This is an important advantage over optical transition radiation-based diagnostics and increases the utility of this invention for usage on accelerators. For example, the diffraction radiation device of the present invention can be left in place for continuous monitoring of the beam characteristics. This suggests the possibility of using the output from the diffraction radiation device to provide continuous feedback for automatic control of the accelerator components.

Like optical transition radiation, the diffraction radiation device is capable of single-shot measurements. This can be further enhanced by taking advantage of the coherent effects of a multi-element system, as described below.

A very advantageous feature of the diffraction radiation diagnostic device by which it differs from all other diffraction radiation devices is the inclination of the element or elements at an non-normal angle with respect to the beam direction. If the angle, for example, is 45 degrees, this inclination produces reflected diffraction radiation directed at 90 degrees with respect to the direction of the charged particle beam 11. This advantageous feature allows an unobstructed view of the diffraction radiation, with little background interference from forward directed radiation such as bremsstrahlung, and requires no other directing mirrors within the beam path to complicate or interfere with the diffraction radiation produced by the aperture.

The diffraction radiation diagnostic device may use either single or multiple apertures. A multiple aperture diffraction radiation diagnostic system consists of two or more apertures placed in series along the beam path. Use of multiple elements in the device allows the observation of interference of diffraction radiation from each element, which increases the intensity of diffraction radiation produced (by a factor equal to the square of the number of elements). The use of multiple elements also improves the sensitivity of the measurements to small changes in the beam parameters, e.g., divergence and emittance. This has been demonstrated in the prior art for optical transition radiation.

Figure 2:
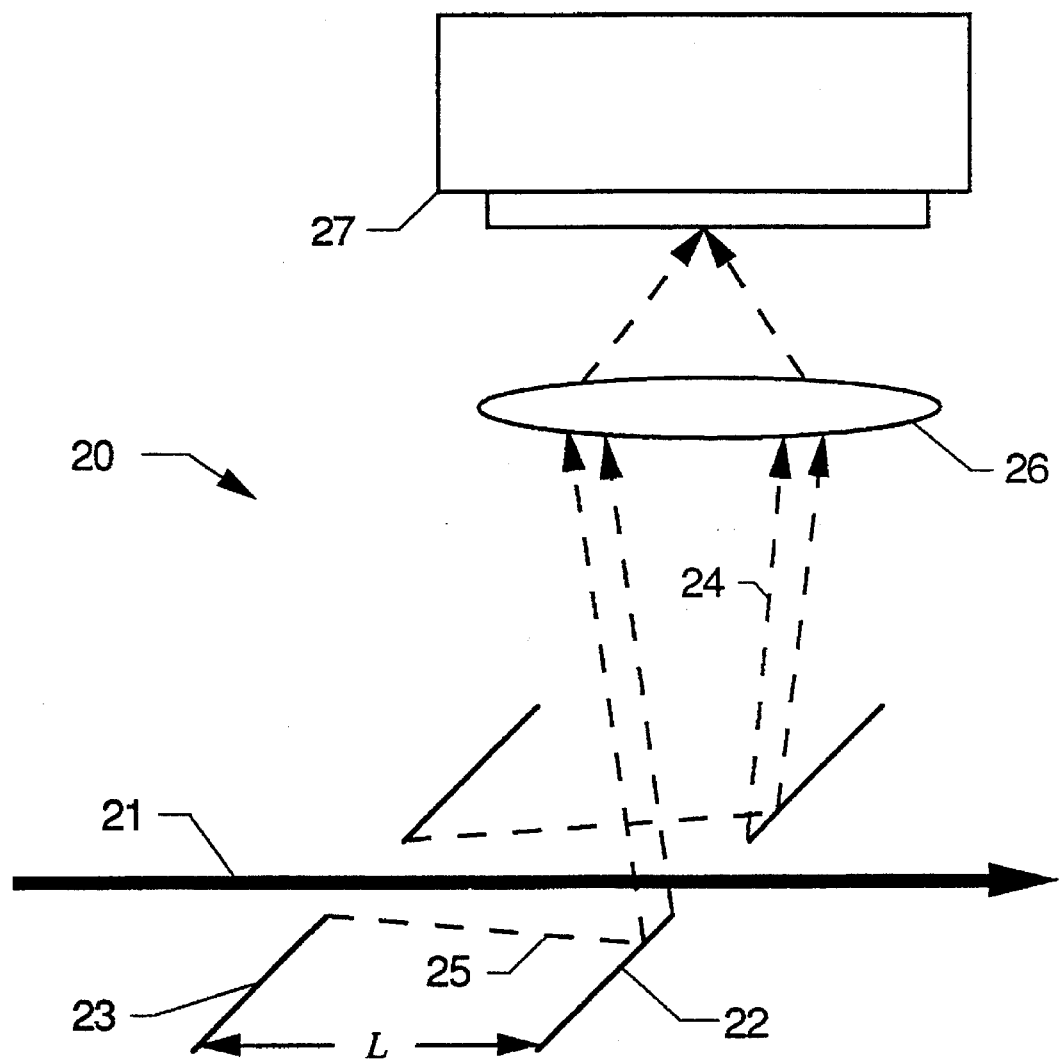
FIG. 2 is a schematic diagram of a second preferred embodiment of the present invention.

FIG. 2 is a schematic diagram of a second preferred embodiment of the present invention. This second preferred embodiment is a multi-element embodiment. The embodiment includes a second element 23 upstream of a first element 22, relative to a charged particle beam 21. The angle of the second element 23 with respect to the charged particle beam 21 is not critical. Forward diffraction radiation 25 from element 23 reflects from the front surface of the first element 22, which is designed to be highly reflective for the forward diffraction radiation 25 emitted by the second element 23. The forward diffraction radiation 25 from the second element 23 then combines with the reflected diffraction radiation 24 from the first element 22, thereby enhancing the total signal sensed by a detector 27. Interference between diffraction radiation is produced from each feature (such as an aperture or edge as discussed previously) when these individual features are placed along the beam path separated by a distance less than or of the order of the vacuum coherence length L. L is defined by the expression $L \sim \gamma^2 \lambda/2\pi$, where $\gamma$ and $\lambda$ are defined above.

Interference fringes can be observed either as a function of angle at a fixed wavelength, or as a function of wavelength at a fixed angle of observation. The latter mode is the basis of U.S. Pat. No. 5,045,695, which measures and uses the spectrum of interference transition radiation from two elements to determine beam divergence. Similar information can be obtained from the diffraction radiation device shown in FIG. 2, but with the advantage of being noninterceptive to the beam.

Figure 3:
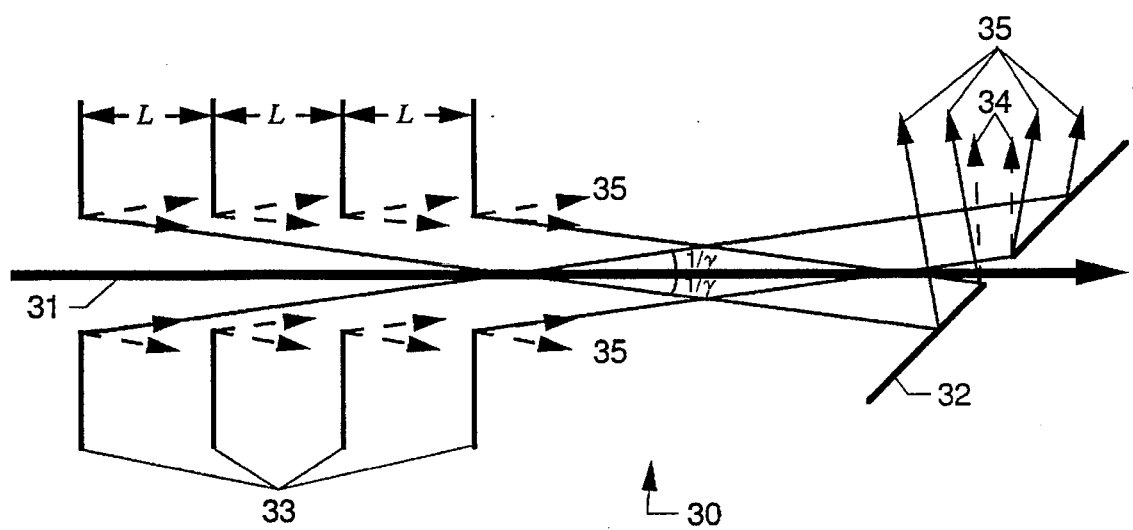
FIG. 3 is a schematic diagram of a third embodiment of the inventive device.

FIG. 3 is a schematic diagram of a third embodiment of the inventive device. This embodiment is an extension of the double element diffraction radiation device, and includes the multielement diffraction radiation device 30. The multielement diffraction radiation device 30 includes a charged particle beam 31 traveling through multiple elements 33 separated by distance L. Forward diffraction radiation emitted from these elements 33 is directed at a mirror 32 with an aperture positioned downstream (relative to the charged particle beam) of the multiple elements 33. The aperture of the mirror 32 is further positioned so that the diffraction radiation 35 reflects off the mirror 32 towards a focusing and detector system similar to that presented in FIGS. 1 and 2.

If the mirror 32 is far enough from the aperture so that the distance is>>L, the aperture in mirror 32 can be larger than the apertures in elements 33 such that the reflected diffraction radiation 34 emitted from the mirror 32 is negligible and will not interfere with the forward diffraction radiation 35 emitted by the elements 33. Alternatively, the aperture in mirror 32 can be the same size as the apertures in elements 33, and the mirror can be positioned at a distance ~L from the elements 33, thereby allowing the reflected diffraction radiation 34 from mirror 32 to add coherently with the forward diffraction radiation 35 from elements 33, in a manner similar to the two-element system given in FIG. 2.

The configurations depicted in FIGS. 1–3 are only a few the variations of the embodiment of the inventive diffraction radiation diagnostic device. The diffraction radiation device can be constructed using circular and noncircular apertures (e.g.,) rectangular), knife edges, and other shapes. These various aperture include all variants, such as one, two, or more apertures or edges, with or without reflecting coatings, and placement of the apertures or edges at various distances less than or greater than the vacuum coherence length. The diameters of the foil apertures or the distance to the edge of an object producing diffraction radiation in any form of the inventive diffraction radiation diagnostic device can be made remotely adjustable. This permits varying the diffraction radiation characteristics and optimizing the diffraction radiation production and wavelength for a given beam energy and size. Depending on the energy of the charged particle beam, aperture dimensions, and the position of the charged particle beam relative to the edges, diffraction radiation will be produced at wavelengths varying from the millimeter through the optical and into the x-ray region of the electromagnetic spectrum. The breadth of the invention includes operability in all wavelength regions and appropriate radiation collection and detection devices.

A beamsplitter, for operation on the beam of emitted diffraction radiation, can be included before the focusing system 14 (for example) to direct the diffraction radiation to more than one detector simultaneously. This allows monitoring and measurement of more than one charged particle beam parameter at the same time, as has been shown in the prior art for optical transition radiation. For example, one such embodiment can 1) monitor the spatial distribution of the diffraction radiation focused at the element and reflected by the beamsplitter to a two dimensional detector and 2) simultaneously monitor the spectral distribution of the diffraction radiation passing directly through the beamsplitter to a spectrometer. Such beamsplitters are available for various regions of the spectrum including the visible, infrared, far infrared, and millimeter wavelength regions.

Irises can be placed before or after the focusing collector to restrict the angular acceptance of the detection system and narrowband wavelength filters can be placed in front of the detector. These may be helpful, for example, in using diffraction radiation as a monitor in an automatic feedback system to control the accelerator. In this case, drift in an accelerator component may cause the diffraction radiation emission angle to change for a particular wavelength. The feedback loop would strive to maintain a constant diffraction radiation signal, thereby providing stable accelerator performance.

While the foregoing is a detailed description of the preferred embodiment of the invention, there are many alternative embodiments of the invention that would occur to those skilled in the art and which are within the scope of the present invention. Accordingly, the present invention is to be determined by the following claims.

We claim:

1. Apparatus to determine any one or more of a predetermined group of parameters relating to a charged particle beam containing one or more charged particles, the beam having a trajectory and a transverse cross-section along the trajectory, the one or more parameters being determinable at any point along the beam trajectory, the apparatus comprising:

a diffraction radiation generator disposed within the beam, the diffraction radiation generator generating forward diffraction radiation along a forward direction along the direction of the beam and reflected diffraction radiation at a predetermined angle with respect to the direction of the beam, each of the forward diffraction radiation and the reflected diffraction radiation having a direction, wherein the diffraction radiation generator includes an element having a feature such that said beam can pass adjacent said feature without being intercepted by said element;

a first focusing system disposed along at least one of the forward diffraction radiation and the reflected diffraction radiation and having an output plane, the first focusing system collecting said diffraction radiation along the direction of said at least one of the forward diffraction radiation and the reflected diffraction radiation and detecting said diffraction radiation on said output plane; and a first detector disposed at the output plane of said first focusing system to measure said diffraction radiation.

2. The apparatus of claim 1, further comprising a beam splitting system disposed between said first focusing system and said first detector, the beam splitting system directing the diffraction radiation to a second detector.

3. The apparatus of claim 2 wherein said beam splitting system is coated to reflect and transmit certain predetermined wavelengths.

4. The apparatus of claim 1, further comprising a beam splitting system disposed along one of the paths of the diffraction radiation between said diffraction radiation generator and said first focusing system, the beam splitting system directing the diffraction radiation to at least one other detector.

5. The apparatus of claim 4 wherein said beam splitting system is coated to reflect and transmit certain predetermined wavelengths.

6. The apparatus of claim 1, further comprising a wavelength filter device disposed between said first detector and the diffraction radiation generator, the filter device selecting at least one predetermined wavelength of the diffraction radiation.

7. The apparatus of claim 6 wherein said filter device includes at least one element taken from a class of devices that select certain predetermined wavelengths, said class of devices including spectrometers, monochromators, color filters, interference filters, gratings, and prisms.

8. The apparatus of claim 1 wherein said feature of said element is taken from a feature group including interfaces between media of different dielectric constants, edges, and apertures having arbitrary sizes and shapes, including circular and rectangular shapes.

9. The apparatus of claim 8 wherein the aperture sizes and shapes are variable.

10. The apparatus of claim 8 wherein said feature is separated from the centroid of the cross-section of said beam by a distance that is of order $\gamma\lambda$, where $\gamma$ is the relativistic energy factor equal to the total energy of the charged particle beam divided by the rest mass energy of the particle and $\lambda$ is the wavelength of the diffraction radiation.

11. The apparatus of claim 8 wherein the diffraction radiation generator includes a plurality of elements, each of said elements having a feature taken from the feature group.

12. The apparatus of claim 11 wherein at least one element in the plurality of elements is coated to reflect the diffraction radiation produced by the diffraction radiation generator.

13. The apparatus of claim 11 wherein at least two features of the features of elements in the plurality of elements are separated by a distance less than the vacuum coherence length L, defined by the expression $L \sim \gamma^2 \lambda/2\pi$, where $\gamma$ is the relativistic energy factor equal to the total energy of the charged particle beam divided by the rest mass energy of the particle and $\lambda$ is the diffraction radiation wavelength, resulting in interferences between said diffraction radiation produced by said respective features, resulting in enhanced diffraction radiation and higher sensitivity to small changes in the beam characteristics than a single feature diffraction radiation generator.

14. The apparatus of claim 13 wherein at least two features of the features of elements in the plurality of elements are separated by a distance greater than the vacuum coherence length L.

15. The apparatus of claim 1 wherein said element is a nonplanar element.

16. The apparatus of claim 1 wherein said predetermined group of parameters includes spatial distribution, temporal distribution, divergence, emittance and energy of the particle beam.

17. The apparatus of claim 1 wherein the charged particle beam contains a plurality of charged particles that are radiating independently and said diffraction radiation generated by said diffraction radiation generator in response to different charged particles of the beam are incoherent.

18. The apparatus of claim 1 wherein the charged particle beam contains an ensemble of charged particles in a bunch within the beam where, for a given beam radius r and beam pulse length $L_{bp}$, said diffraction radiation is coherently generated at wavelengths that satisfy $L_{bp} \sim \lambda \sim 2\pi r/\gamma$, where $\lambda$ is the wavelength and $\gamma$ is the relativistic energy factor equal to the total energy of the charged particle beam divided by the rest mass energy of the particle.

19. The apparatus of claim 1 wherein said charged particles are characterized by a wavelength in a continuous wavelength range that includes the wavelength of x-rays and the wavelength of millimeter waves.

20. The apparatus of claim 1 wherein said diffraction radiation has intensities having a spatial distribution and said first detector includes an intensity detector to measure the magnitude of said intensity of said diffraction radiation.

21. The apparatus of claim 1 wherein said diffraction radiation has an intensity having a spatial distribution and said measurement of the diffraction radiation includes a spatial measurement device to measure said spatial distribution of said diffraction radiation.

22. The apparatus of claim 1 wherein said diffraction radiation has an intensity having an angular distribution and said measurement of the diffraction radiation includes an angular measurement device to measure said angular distribution of said diffraction radiation.

23. The apparatus of claim 1 wherein said diffraction radiation has an intensity having a spectral distribution and said measurement of the diffraction radiation includes a spectral measurement device to measure said spectral distribution of said diffraction radiation.

24. A method for determining any one or more of a predetermined group of parameters relating to a charged particle beam containing one or more charged particles, the beam having a trajectory and a transverse cross-section along the trajectory, the one or more parameters being determinable at any point along the beam trajectory, the method comprising the steps of:

a) supplying a diffraction radiation generator;

b) disposing the diffraction radiation generator within the beam so that the diffraction radiation generator generates forward diffraction radiation along a forward direction along the direction of the beam and reflected diffraction radiation at an angle with respect to the direction of the beam, each of the forward diffraction radiation and the reflected diffraction radiation having a direction, wherein the diffraction radiation generator includes an element having a feature such that said beam can pass adjacent said feature without being intercepted by said element;

c) supplying a focusing system having an output plane;

d) disposing the focusing system along at least one of the forward diffraction radiation and the reflected diffraction radiation, the focusing system collecting said diffraction radiation along the direction of said at least one of the forward diffraction radiation and the reflected diffraction radiation and detecting said diffraction radiation on said output plane;

e) supplying a detector; and f) disposing the detector at the output plane of said focusing system.

25. The method of claim 24 wherein step a) further includes furnishing the diffraction radiation generator with a plurality of elements, each of said elements having a feature taken from a feature group including interfaces between media of different dielectric constants, edges, and apertures having arbitrary sizes and shapes, including circular and rectangular shapes.

26. The method of claim 25 wherein step a) includes furnishing the diffraction radiation generator with a plurality of elements, each of said elements having a feature in the feature group, at least two features of the features of elements in the plurality of elements being separated by a distance less than or of order of the vacuum coherence length L, defined by the expression $L \sim \gamma^2 \lambda/2\pi$, where $\lambda$ is the wavelength, resulting in interferences between said diffraction radiation produced by said respective features and enhancing said diffraction radiation imaged on said output plane.

27. The method of claim 24 wherein the charged particle beam contains an ensemble of charged particles in a bunch within the beam where, for a given beam radius r and beam pulse length $L_{bp}$, said diffraction radiation is coherently generated at wavelengths that satisfy $L_{bp} \sim \lambda \sim 2\pi r/\gamma$, where $\lambda$ is the wavelength and $\gamma$ is the relativistic energy factor equal to the total energy of the charged particle beam divided by the rest mass energy of the particle.

28. An apparatus for determining any one or more of a predetermined group of parameters relating to a charged particle beam containing one or more charged particles, the beam having a trajectory and a transverse cross-section along the trajectory, the one or more parameters being determinable at any point along the beam trajectory, the apparatus comprising:

means for generating diffraction radiation;

means for disposing the means for generating diffraction radiation within the beam so that the means for generating diffraction radiation generates forward diffraction radiation along a forward direction along the direction of the beam and reflected diffraction radiation at an angle with respect to the direction of the beam, each of the forward diffraction radiation and the reflected diffraction radiation having a direction, wherein the diffraction radiation generator includes an element having a feature such that said beam can pass adjacent said feature without being intercepted by said element;

means for focusing, said means for focusing having an output plane;

means for disposing the means for focusing along at least one of the forward diffraction radiation and the reflected diffraction radiation, the means for focusing collecting said diffraction radiation along the direction of said at least one of the forward diffraction radiation and the reflected diffraction radiation;

means for detecting said diffraction radiation on said output plane; and means for disposing the means for detecting at the output plane of said means for focusing.

29. The apparatus of claim 28 wherein the means for generating diffraction radiation includes a plurality of elements, each of said elements having a feature taken from a feature group including interfaces between media of different dielectric constants, edges, and apertures having arbitrary sizes and shapes, including circular and rectangular shapes.

30. The apparatus of claim 29 wherein the means for generating diffraction radiation includes a plurality of elements, each of said elements having a feature in the feature group, at least two features of the features of elements in the plurality of elements being separated by a distance less than or of order of the vacuum coherence length L, defined by the expression $L \sim \gamma^2 \lambda/2\pi$, where $\gamma$ is the relativistic energy factor equal to the total energy of the charged particle beam divided by the rest mass energy of the particle, $\lambda$ is the wavelength, resulting in interferences between said diffraction radiation produced by said respective features and enhancing said diffraction radiation imaged on said output plane.

31. The apparatus of claim 28 wherein the charged particle beam contains an ensemble of charged particles in a bunch within the beam where, for a given beam radius r and beam pulse length $L_{bp}$, said diffraction radiation is coherently generated at wavelengths that satisfy $L_{bp} \sim \lambda \sim 2\pi r/\gamma$, where $\lambda$ is the wavelength and $\gamma$ is the relativistic energy factor equal to the total energy of the charged particle beam divided by the rest mass energy of the particle.

\* \* \* \* \*